(12) United States Patent
Barron et al.

(10) Patent No.: US 7,702,711 B2
(45) Date of Patent: Apr. 20, 2010

(54) REDUCED COMPLEXITY RECURSIVE LEAST SQUARE LATTICE STRUCTURE ADAPTIVE FILTER BY MEANS OF ESTIMATING THE BACKWARD AND FORWARD ERROR PREDICTION SQUARES USING BINOMIAL EXPANSION

(75) Inventors: David L. Barron, Scottsdale, AZ (US); James B. Piket, Gilbert, AZ (US); Daniel Rokusek, Long Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 895 days.

(21) Appl. No.: 11/399,906

(22) Filed: Apr. 7, 2006

(65) Prior Publication Data

US 2006/0288064 A1    Dec. 21, 2006

Related U.S. Application Data

(60) Provisional application No. 60/692,345, filed on Jun. 20, 2005, provisional application No. 60/692,236, filed on Jun. 20, 2005, provisional application No. 60/692,347, filed on Jun. 20, 2005.

(51) Int. Cl.
G06F 17/10 (2006.01)
(52) U.S. Cl. .................................................. 708/322
(58) Field of Classification Search ........................ None
See application file for complete search history.

(56) References Cited

U.S. PATENT DOCUMENTS

| 4,032,762 | A | * | 6/1977 | Caloyannides ............... 708/322 |
|---|---|---|---|---|
| 5,353,307 | A |   | 10/1994 | Lester et al. |
| 5,418,714 | A |   | 5/1995 | Barron et al. |
| 5,432,816 | A |   | 7/1995 | Gozzo |
| 5,432,821 | A |   | 7/1995 | Polydoros et al. |
| 5,513,215 | A |   | 4/1996 | Marchetto et al. |
| 5,615,208 | A |   | 3/1997 | Hagmanns |
| 5,809,086 | A |   | 9/1998 | Ariyavisitakul |
| 5,844,951 | A |   | 12/1998 | Proakis et al. |
| 6,327,302 | B1 |   | 12/2001 | Shen |
| 6,353,629 | B1 |   | 3/2002 | Pal |
| 6,381,272 | B1 |   | 4/2002 | Ali |
| 6,445,692 | B1 |   | 9/2002 | Tsatsanis |
| 6,643,676 | B1 |   | 11/2003 | Slock et al. |
| 6,658,071 | B1 |   | 12/2003 | Cheng |
| 6,760,374 | B1 |   | 7/2004 | Tapp et al. |
| 6,763,064 | B1 |   | 7/2004 | Graf et al. |
| 6,801,565 | B1 |   | 10/2004 | Bottomley et al. |
| 6,807,229 | B1 | * | 10/2004 | Kim et al. ................... 375/233 |
| 6,810,073 | B1 |   | 10/2004 | Karlsson |
| 7,027,504 | B2 |   | 4/2006 | Yousef et al. |
| 7,113,540 | B2 |   | 9/2006 | Yousef et al. |

(Continued)

OTHER PUBLICATIONS

Cioffi, J., "The Fast Householder Filters RLS Adaptive Filter," IEEE, pp. 1619-1622 (1990).

(Continued)

*Primary Examiner*—David H Malzahn
(74) *Attorney, Agent, or Firm*—Nathan O. Green; Brinks Hofer Gilson & Lione

(57) ABSTRACT

A method for reducing a computational complexity of an m-stage adaptive filter is provided by expanding a weighted sum of forward prediction error squares into a corresponding binomial expansion series, expanding a weighted sum of backward prediction error squares into a corresponding binomial expansion series, and determining coefficient updates of the adaptive filter with the weighted sums of forward and backward prediction error squares approximated by a select number of terms of their corresponding binomial expansion series.

9 Claims, 6 Drawing Sheets

U.S. PATENT DOCUMENTS

| | | | |
|---|---|---|---|
| 7,533,140 B2* | 5/2009 | Jaber | 708/322 |
| 7,548,582 B2* | 6/2009 | Kim et al. | 375/232 |
| 2001/0021940 A1 | 9/2001 | Fujii et al. | |
| 2003/0023650 A1 | 1/2003 | Papathanasiou | |
| 2004/0117417 A1 | 6/2004 | Jin et al. | |
| 2006/0041403 A1* | 2/2006 | Jaber | 702/189 |
| 2006/0288066 A1 | 12/2006 | Barron et al. | |
| 2006/0288067 A1 | 12/2006 | Barron et al. | |

OTHER PUBLICATIONS

Marple, S. Lawrence, "Two-Dimensional Lattice Linear Prediction Parameter Estimation Method and Fast Algorithm," 7(6) IEEE Signal Processing Letters 164-168 (Jun. 2000).

Meng, Julian, "A Modified Recursive Least Squares Adaptive Lattice Filter for Narrowband Interference Rejection," IEEE, pp. 969-972 (May 2003).

Merched, Ricardo, et al., "Extended Fast Fixed Order RLS Adaptive Filters," IEEE, pp. II-665 to II-668 (2001).

Merched, Ricardo, et al., "Extended Fast Fixed-Order RLS Adaptive Filters," 49(12) IEEE Transactions on Signal Processing 3015-3031 (Dec. 2001).

International Search Report and Written Opinion for International Patent Application No. PCT/US06/22285, dated Mar. 26, 2008 (8 pages).

* cited by examiner

REDUCED COMPLEXITY RECURSIVE LEAST SQUARE LATTICE STRUCTURE ADAPTIVE FILTER BY MEANS OF ESTIMATING THE BACKWARD AND FORWARD ERROR PREDICTION SQUARES USING BINOMIAL EXPANSION

RELATED APPLICATIONS

This application claims the benefit of U.S. Provisional Application No. 60/692,345, filed Jun. 20, 2005, U.S. Provisional Application No. 60/692,236, filed Jun. 20, 2005, and U.S. Provisional Application No. 60/692,347, filed Jun. 20, 2005, all of which are incorporated herein by reference.

FIELD OF THE INVENTION

The present invention relates, in general to, adaptive filters and, more particularly, to a reduced complexity recursive least square lattice structure adaptive filter.

BACKGROUND

Adaptive filters are found in a wide range of applications and come in a wide variety of configurations, each of which having distinctive properties. A particular configuration chosen may depend on specific properties needed for a target application. These properties, which include among others, rate of convergence, mis-adjustment, tracking, and computational requirements, are evaluated and weighed against each other to determine the appropriate configuration for the target application.

Of particular interest when choosing an adaptive filter configuration for use in a non-stationary signal environment are the rate of convergence, the mis-adjustment and the tracking capability. Good tracking capability is generally a function of the convergence rate and mis-adjustment properties of a corresponding algorithm. However, these properties may be contradictory in nature, in that a higher convergence rate will typically result in a higher convergence error or mis-adjustment of the resulting filter.

A recursive least squares (RLS) algorithm is generally a good tool for the non-stationary signal environment due to its fast convergence rate and low level of mis-adjustment. A recursive least squares lattice (RLSL) algorithm is one particular version of the RLS algorithm. The initial RLSL algorithm was introduced by Simon Haykin, and can be found in the "Adaptive Filter Theory Third Edition" book. The RLS class of adaptive filters exhibit fast convergence rates and are relatively insensitive to variations in an eigenvalue spread. Eigenvalues are a measure of correlation properties of the reference signal and the eigenvalue spread is typically defined as a ratio of the highest eigenvalue to the lowest eigenvalue. A large eigenvalue spread significantly slows down the rate of convergence for most adaptive algorithms.

However, the RLS algorithm typically requires extensive computational resources and can be prohibitive for embedded systems. Accordingly, there is a need to provide a mechanism by which the computational requirements of a RLSL structure adaptive filter are reduced.

Illustrative and exemplary embodiments of the invention are described in further detail below with reference to and in conjunction with the figures.

DETAILED DESCRIPTION

A method for reducing a computational complexity of an m-stage adaptive filter is provided by expanding a weighted sum of forward prediction error squares into a corresponding binomial expansion series, expanding a weighted sum of backward prediction error squares into a corresponding binomial expansion series, and determining coefficient updates of the adaptive filter with the weighted sums of forward and backward prediction error squares approximated by a select number of terms of their corresponding binomial expansion series. The present invention is defined by the appended claims. This description addresses some aspects of the present embodiments and should not be used to limit the claims.

FIGS. 1a-1d illustrate four schematic diagrams of filter circuits 100 employing an adaptive filter 10. The filter circuits 100 in general and the adaptive filter 10 may be constructed in any suitable manner. In particular, the adaptive filter 10 may be formed using electrical components such as digital and analog integrated circuits. In other examples, the adaptive filter 10 is formed using a digital signal processor (DSP) operating in response to stored program code and data maintained in a memory. The DSP and memory may be integrated in a single component such as an integrated circuit, or may be maintained separately. Further, the DSP and memory may be components of another system, such as a speech processing system or a communication device.

In general, an input signal u(n) is supplied to the filter circuit 100 and to adaptive filter 10. As shown, the adaptive filter 10 may be configured in a multitude of arrangements between a system input and a system output. It is intended that the improvements described herein may be applied to the widest variety of applications for the adaptive filter 10.

Figure 1A:
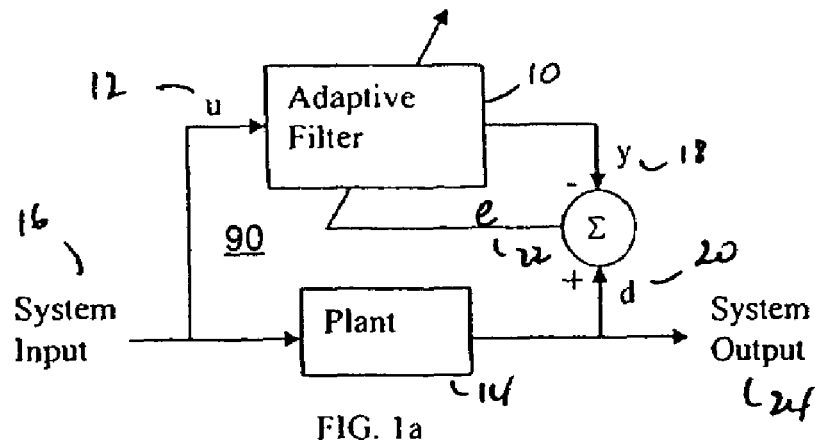
FIGS. 1a-1d illustrate four schematic diagrams of applications employing an adaptive filter.

In FIG. 1a, an identification type application of the adaptive filter 10 is shown. In FIG. 1a, the filter circuit 100 includes an adaptive filter 10, a plant 14 and a summer. The plant 14 may be any suitable signal source being monitored. In this arrangement, the input signal u(n) is received at an input 12 and is supplied to the adaptive filter 10 and to a signal processing plant 14 from a system input 16. A filtered signal y(n) 18 supplied by adaptive filter 10 is subtracted from a signal id(n) 20 supplied by plant 14 to produce an error signal e(n) 22, that is fed back to the adaptive filter 10. In this identification type application, signal id(n) 20 also represents an output signal of the system output 24.

Figure 1B:
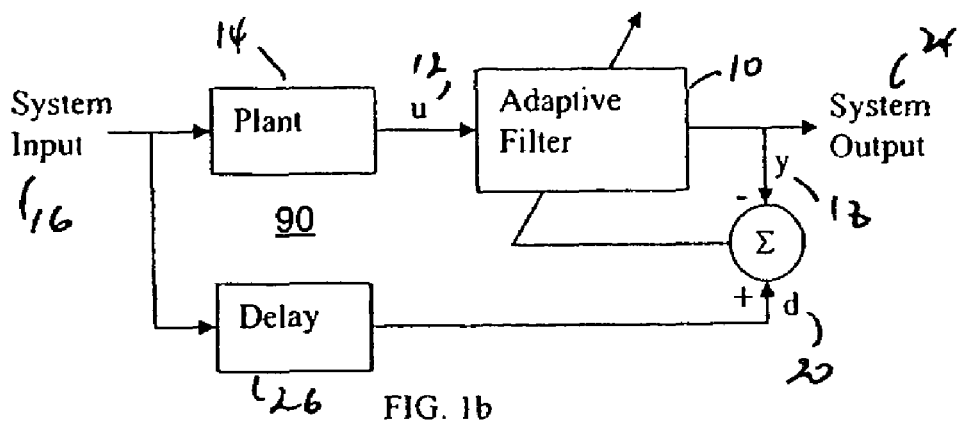

In FIG. 1b, an inverse modeling type application of the adaptive filter 10 is shown. In FIG. 1b, the filter circuit 100 includes an adaptive filter 10, a plant 14, summer and a delay process 26. In this arrangement, an input signal originating from system input 16 is transformed into the input signal u(n) 12 of the adaptive filter 10 by plant 14, and converted into signal d(n) 20 by a delay process 26. Filtered signal y(n) 18 of the adaptive filter 10 is subtracted from signal id(n) 20 to produce error signal e(n) 22, that is fed back to the adaptive filter 10.

Figure 1C:
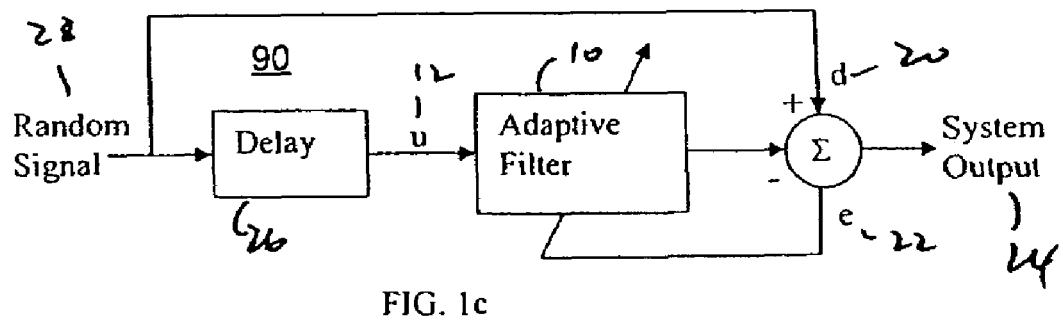

In FIG. 1c, a prediction type application of the adaptive filter 10 is shown. In FIG. 1c, the filter circuit 100 includes an adaptive filter 10, a summer and a delay process 26. In this arrangement, adaptive filter 10 and delay process 26 are arranged in series between system input 16, now supplying a random signal input 28, and the system output 24. As shown, the random signal input 28 is subtracted as signal d(n) 20 from filtered signal y(n) 18 to produce error signal e(n) 22, that is fed back to the adaptive filter 10. In this prediction type application, error signal e(n) 22 also represents the output signal supplied by system output 24.

Figure 1D:
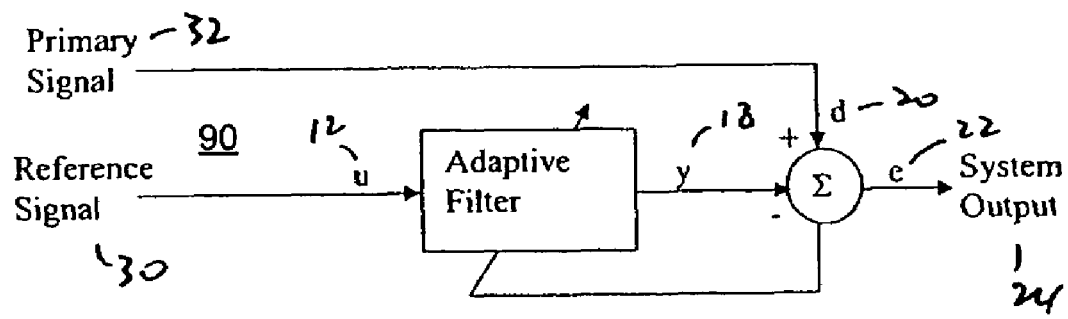

In FIG. 1d, an interference canceling type application of the adaptive filter 10 is shown. In FIG. 1d, the filter circuit 100 includes an adaptive filter 10 and a summer. In this arrangement, a reference signal 30 and a primary signal 32 are provided as input signal u(n) 12 and as signal d(n) 20, respectively. As shown, primary signal 32 is subtracted as signal d(n) 20 from filtered signal y(n) 18 to produce error signal e(n) 22, which is fed back to the adaptive filter 10. In this interference canceling type application, error signal e(n) 22 also represents the output signal supplied the system output 24.

Figure 2:
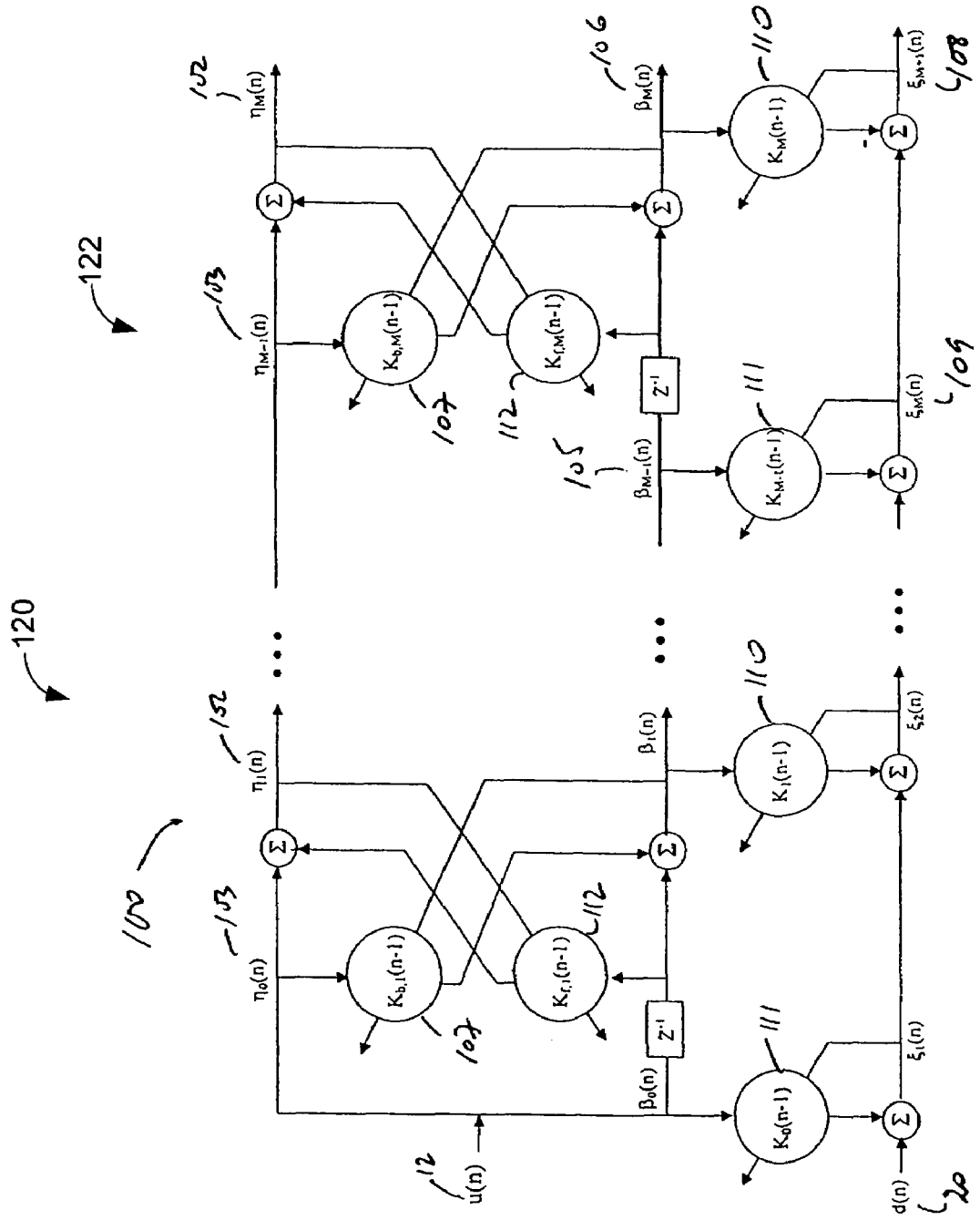
FIG. 2 is a block diagram of a RLSL structure adaptive filter according to the invention.

Now referring to FIG. 2, a block diagram of an m-stage RLSL structure adaptive filter 100 is shown. The adaptive filter 100 includes a plurality of stages including a first stage 120 and an m-th stage 122. Each stage (m) may be characterized by a forward prediction error $\eta_m(n)$ 102, a forward prediction error $\eta_{m-1}(n)$ 103, a forward reflection coefficient $K_{f,m-m}(n-1)$ 104, a delayed backward prediction error $\beta_{m-1}(n)$ 105, a backward prediction error $\beta(n)$ 106, a backward reflection coefficient $K_{b,m}(n-1)$ 107, an a priori estimation error backward $\xi_m(n)$ 108, an a priori estimation error backward $\xi_{m-1}(n)$ 109 and a joint process regression coefficient $K_{m-1}(n-1)$ 110. This m-stage adaptive filter RLSL 100 is shown with filter coefficients updates indicated by arrows drawn through each coefficient block. These filter coefficient updates are recursively computed for each stage (m) of a filter length of the RLSL 100 and for each sample time (n) of the input signal u(n) 12.

An RLSL algorithm for the RLSL 100 is defined below in terms of Equation 1 through Equation 8.

$$F_{m-1}(n) = \lambda F_{m-1}(n-1) + \gamma_{m-1}(n-1)|\eta_{m-1}(n)|^2 \quad \text{Equation 1}$$

$$B_{m-1}(n-1) = \lambda B_{m-1}(n-2) + \gamma_{m-1}(n-1)|\beta_{m-1}(n-1)|^2 \quad \text{Equation 1}$$

$$\eta_m(n) = \eta_{m-1}(n) + K_{f,m}(n-1)\beta_{m-1}(n-1) \quad \text{Equation 2}$$

$$\beta_m(n) = \beta_{m-1}(n-1) + K_{b,m}(n-1)\eta_{m-1}(n) \quad \text{Equation 3}$$

$$K_{f,m}(n) = K_{f,m}(n-1) - \frac{\gamma_{m-1}(n-1)\beta_{m-1}(n-1)}{B_{m-1}(n-1)}\eta_m(n) \quad \text{Equation 4}$$

$$K_{b,m}(n) = K_{b,m}(n-1) - \frac{\gamma_{m-1}(n-1)\eta_{m-1}(n-1)}{F_{m-1}(n)}\beta_m(n) \quad \text{Equation 5}$$

-continued $$\gamma_m(n-1) = \gamma_{m-1}(n-1) - \frac{\gamma_{m-1}^2(n-1)|\beta_{m-1}(n-1)|^2}{B_{m-1}(n-1)} \quad \text{Equation 6}$$

$$\xi_m(n) = \xi_{m-1}(n) - K_{m-1}(n-1)\beta_{m-1}(n) \quad \text{Equation 7}$$

$$K_{m-1}(n) = K_{m-1}(n-1) + \frac{\gamma_{m-1}(n)\beta_{m-1}(n)}{B_{m-1}(n)}\xi_m(n) \quad \text{Equation 8}$$

Where the variables are defined as follows:
$F_m(n)$ Weighted sum of forward prediction error squares for stage m at time n.
$B_m(n)$ Weighted sum of backward prediction error squares for stage m at time n.
$\eta_m(n)$ Forward prediction error.
$\beta_m(n)$ Backward prediction error.
$K_{b,m}(n)$ Backward reflection coefficient for stage m at time n.
$K_{f,m}(n)$ Forward reflection coefficient for stage m at time n.
$K_m(n)$ Joint process regression coefficient for stage m at time n.
$\gamma_m(n)$ Conversion factor for stage m at time n.
$\zeta_m(n)$ A priori estimation error for stage m at time n.
$\lambda$ Exponential weighting factor or gain factor.

At stage zero, the RLSL 100 is supplied by signals u(n) 12 and d(n) 20. Subsequently, for each stage m, the above defined filter coefficient updates are recursively computed. For example at stage m and time n, the forward prediction error $\eta m(n)$ 102 is the forward prediction error $\eta m-1$ (n) 103 of stage m-1 augmented by a combination of the forward reflection coefficient Kf,m-1 (n-1) with the delayed backward prediction error $\beta m-1$ (n).

In a similar fashion, at stage m and time n, the backward prediction error $\beta m$ (n) 106 is the backward prediction error $\beta m-1$ (n) 105 of stage m-1 augmented by a combination of the backward reflection coefficient Kb,m-1 (n-1) with the delayed forward prediction error $\eta m-1$ (n).

Moreover, the a priori estimation error backward $\zeta m$ (n) 107, for stage m at time n, is the a priori estimation error backward $\zeta m-1$ (n) 108 of stage m-1 reduced by a combination of the joint process regression coefficient Km-1 (n-1) 109, of stage m-1 at time n-1, with the backward forward prediction error $\beta m-1$ (n) 105.

The adaptive filter 100 may be implemented using any suitable component or combination of components. In one embodiment, the adaptive filter is implemented using a DSP in combination with instructions and data stored in an associated memory. The DSP and memory may be part of any suitable system for speech processing or manipulation. The DSP and memory can be a stand-alone system or embedded in another system.

This RLSL algorithm requires extensive computational resources and can be prohibitive for embedded systems. As such, a mechanism for reducing the computational requirements of the RLSL structure adaptive filter 100 is obtained by using binomial expansion series in lieu of the divide function in the updates of the forward error prediction squares Fm(n) and the backward error prediction squares Bm (n).

Typically, processors are substantially efficient at adding, subtracting and multiplying, but not necessarily at dividing. Most processors use a successive approximation technique to implement a divide instruction and may require multiple clock cycles to produce a result. As such, in an effort to reduce computational requirements, a total number of computations in the filter coefficient updates may need to be reduced as well as a number of divides that are required in the calculations of the filter coefficient updates. Thus, the RLSL algorithm filter coefficient updates are transformed to consolidate the divides. First, the time (n) and order (m) indices of the RLSL algorithm are translated to form Equation 9 through Equation 17.

$$F_m(n) = \lambda F_m(n-1) + \gamma_m(n-1)|\eta_m(n)|^2 \qquad \text{Equation 9}$$

$$B_m(n) = \lambda B_m(n-1) + \gamma_{m-1}(n)|\beta_m(n)|^2 \qquad \text{Equation 10}$$

$$\eta_m(n) = \eta_{m-1}(n) + K_{f,m}(n-1)\beta_{m-1}(n-1) \qquad \text{Equation 11}$$

$$\beta_m(n) = \beta_{m-1}(n-1) + K_{b,m}(n-1)\eta_{m-1}(n) \qquad \text{Equation 12}$$

$$K_{f,m}(n) = K_{f,m}(n-1) - \frac{\gamma_{m-1}(n-1)\beta_{m-1}(n-1)}{B_{m-1}(n-1)}\eta_m(n) \qquad \text{Equation 13}$$

$$K_{b,m}(n) = K_{b,m}(n-1) - \frac{\gamma_{m-1}(n-1)\eta_{m-1}(n)}{F_{m-1}(n)}\beta_m(n) \qquad \text{Equation 14}$$

$$\gamma_m(n-1) = \gamma_{m-1}(n-1) - \frac{\gamma_{m-1}^2(n)|\beta_{m-1}(n)|^2}{B_{m-1}(n)} \qquad \text{Equation 15}$$

$$\xi_m(n) = \xi_{m-1}(n) - K_{m-1}(n-1)\beta_{m-1}(n) \qquad \text{Equation 16}$$

$$K_m(n) = K_m(n-1) + \frac{\gamma_m(n)\beta_m(n)}{B_m(n)}\xi_{m+1}(n) \qquad \text{Equation 17}$$

Then, the forward error prediction squares Fm(n) and the backward error prediction squares Bm(n) are inverted and redefined to be their reciprocals as shown in Equation 18, Equation 20 and Equation 21. Thus, by inverting Equation 9 we get:

$$\frac{1}{F_m(n)} = \frac{1}{\lambda F_m(n-1) + \gamma_m(n-1)|\eta_m(n)|^2} \qquad \text{Equation 18}$$

Then redefine the forward error prediction squares Fm(n):

$$F' = \frac{1}{F} \qquad \text{Equation 19}$$

Then insert into Equation 18 and simplify:

$$F'_m(n) = \frac{1}{\lambda \frac{1}{F'_m(n-1)} + \gamma_m(n-1)|\eta_m(n)|^2} \qquad \text{Equation 20}$$

$$= \frac{F'_m(n-1)}{\lambda + F'_m(n-1)\gamma_m(n-1)|\eta_m(n)|^2}$$

By the same reasoning the backwards error prediction square Equation 10 becomes $$B'_m(n) = \frac{B'_m(n-1)}{\lambda + B'_m(n-1)\lambda_m(n)|\beta_m(n)|^2} \qquad \text{Equation 21}$$

Further, new definitions for the forward and backward error prediction squares, F'm (n) and B'm(n), are inserted back into the remaining equations, Equation 13, Equation 14, Equation 15, and Equation 17, to produce the algorithm coefficient updates as shown below in Equation 22 through Equation 30.

$$F'_m(n) = \frac{F'_m(n-1)}{\lambda + F'_m(n-1)\gamma_m(n-1)|\eta_m(n)|^2} \qquad \text{Equation 22}$$

$$B'_m(n) = B'_m(n) = \frac{B'_m(n-1)}{\lambda + B'_m(n-1)\gamma_m(n-1)|\beta_m(n)|^2} \qquad \text{Equation 23}$$

$$\beta_m(n) = \beta_{m-1}(n-1) + K_{b,m}(n-1)\eta_{m-1}(n) \qquad \text{Equation 24}$$

$$K_{b,m}(n) = K_{b,m}(n-1) - \gamma_{m-1}(n-1)\eta_{m-1}(n)\beta_m(n)F'_{m-1}(n) \qquad \text{Equation 25}$$

$$\eta_m(n) = \eta_{m-1}(n) + K_{f,m}(n-1)\beta_{m-1}(n) \qquad \text{Equation 26}$$

$$K_{f,m}(n) = K_{f,m}(n-1) - \gamma_{m-1}(n-1)\eta_{m-1}(n)B'_{m-1}(n) \qquad \text{Equation 27}$$

$$\xi_m(n) = \xi_{m-1}(n) - K_{m-1}(n-1)\beta_{m-1}(n) \qquad \text{Equation 28}$$

$$K_m(n) = K_m(n-1) + \gamma_m(n)\beta_m(n)\xi_{m+1}(n)B'_m(n) \qquad \text{Equation 29}$$

$$\gamma_m(n-1) = \gamma_{m-1}(n-1) - \gamma_{m-1}^2(n)|\beta_{m-1}(n)|^2 B'_{m-1}(n) \qquad \text{Equation 30}$$

Figure 3:
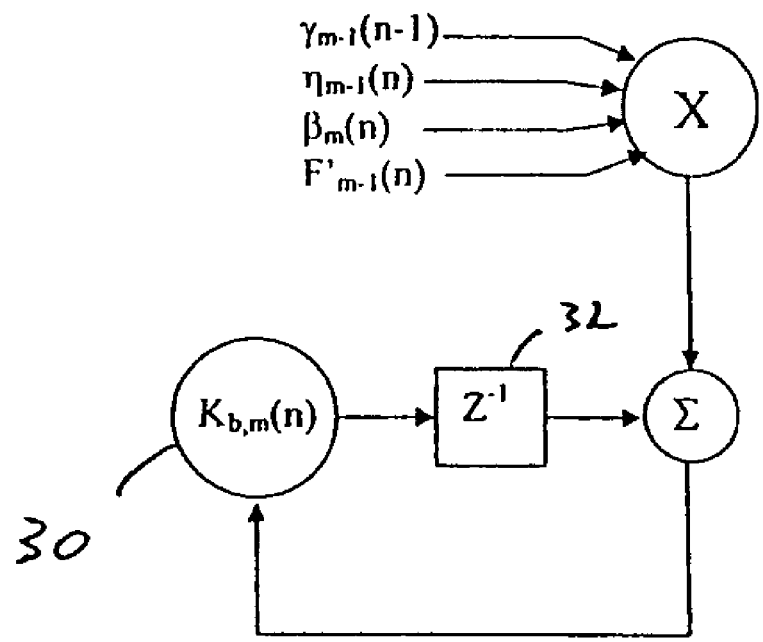
FIG. 3 is a block diagram of a backward reflection coefficient update of the adaptive filter of FIG. 2.

Now referring to FIG. 3, a block diagram of the backward reflection coefficient update Kb,m(n) 30 as evaluated in Equation 25 is shown. The block diagram of FIG. 3 is representative of, for example, a digital signal processor operation or group of operations. The backward reflection coefficient update Kb,m(n) 30 is supplied to a delay 32 and the output of delay 32 Kb,m(n−1) is summed to a product of the forward error prediction squares F'm (n) with the backward prediction error βm(n), the forward prediction error ηm−1 (n), and the conversion factor γm(n−1).

Figure 4:
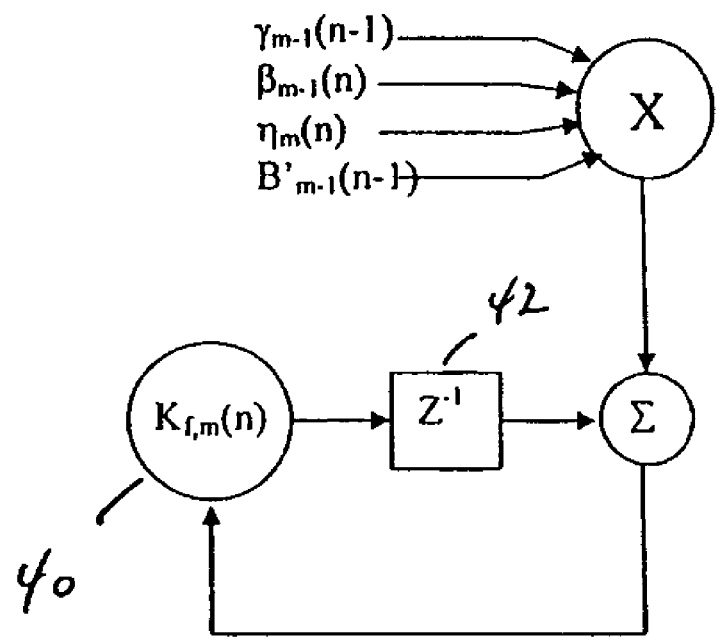
FIG. 4 is a block diagram of a forward reflection coefficient update of the adaptive filter of FIG. 2.

Now referring to FIG. 4, a block diagram of the forward reflection coefficient update Kf,m(n) 40 as evaluated in Equation 28 is shown. Similar to FIG. 3, the block diagram of FIG. 4 is representative of, for example, a digital signal processor operation or group of operations. The backward reflection coefficient update Kb,m(n) 40 is supplied to a delay 42. The output of delay 42 Kf,m(n−1) is summed to a product of the backward error prediction squares B'm−1 (n−1) with the backward prediction error βm−1 (n), the forward prediction error ηm(n), and the conversion faction γm−1 (n−1).

As stated above, the mechanism for reducing the computational requirements of the RLSL structure adaptive filter RLSL 100 is provided by using binomial expansion in lieu of the divide function in the updates of the forward error prediction squares Fm(n) and the backward error prediction squares Bm (n).

Typical processors use an iterative approach to perform a divide function and therefore require substantial resources and real time to calculate a multiply or an add function. As such, the divide function present in each of Equation 22 and Equation 23 for computing the updates of the forward error prediction squares F'm(n) and the backward error prediction squares B'm (n).is replaced with Taylor series expansions to approximate the forward and backward error prediction squares update recursions.

As such, a general binomial series is introduced in Equation 31 as an expansion of Taylor's theorem to provide a tool to estimate the divide function within a given region of convergence. In general, several terms of the series are needed to achieve a predetermined accuracy.

$$(a - bx)^{-1} = \frac{1}{a}\left(1 + \frac{bx}{a} + \frac{b^2 x^2}{a^2} + \frac{b^3 x^3}{a^3} + \ldots\right) \text{ for } b^2 x^2 < a^2 \qquad \text{Equation 31}$$

In order to replace the divide functions in the RLS recursion updates of the forward error prediction squares F'm(n) and the backward error prediction squares B'm (n) found in Equation 22 and Equation 23, respectively, let:

$$a=\lambda \text{ and } bx=-F'_m(n-1)\gamma_m(n-1)|\eta_m(n)|^2$$

Then, using the first two terms in the expansion series of Equation 31, the forwards error prediction squares F'm(n) becomes:

$$\frac{1}{\lambda + F'_m(n-1)\gamma_m(n-1)|\eta_m(n)|^2} \cong \frac{1}{\lambda}\left(1 - \frac{1}{\lambda}F'_m(n-1)\gamma_m(n-1)|\eta_m(n)|^2\right) \quad \text{Equation 32}$$

Since λ is a constant, then $$\frac{1}{\lambda}$$

can be pre-calculated and therefore reduces overhead computation to the recursion loop of the filter updates. After applying the same reasoning to Equation 23, the backwards error prediction squares B'm (n) becomes:

$$\frac{1}{\lambda + B'_m(n-1)\gamma_m(n)|\beta_m(n)|^2} \cong \frac{1}{\lambda}\left(1 - \frac{1}{\lambda}B'_m(n-1)\gamma_m(n)|\beta_m(n)|^2\right) \quad \text{Equation 33}$$

The resulting RLS algorithm with all divides eliminated is given in Equation 34 through Equation 42, as follows:

$$F'_m(n) = F'_m(n-1)\frac{1}{\lambda}\left(1 - \frac{1}{\lambda}F'_m(n-1)\gamma_m(n-1)|\eta_m(n)|^2\right) \quad \text{Equation 34}$$

$$B'_m(n) = B'_m(n-1)\frac{1}{\lambda}\left(1 - \frac{1}{\lambda}B'_m(n-1)\gamma_m(n)|\beta_m(n)|^2\right) \quad \text{Equation 35}$$

$$\beta_m(n) = \beta_{m-1}(n-1) + K_{b,m}(n-1)\eta_{m-1}(n) \quad \text{Equation 36}$$

$$K_{b,m}(n) = K_{b,m}(n-1) - \gamma_{m-1}(n-1)\eta_{m-1}(n)\beta_m(n)F'_{m-1}(n) \quad \text{Equation 37}$$

$$\eta_m(n) = \eta_{m-1}(n) + K_{f,m}(n-1)\beta_{m-1}(n-1) \quad \text{Equation 38}$$

$$K_{f,m}(n) = K_{f,m}(n-1) - \gamma_{m-1}(n-1)\beta_{m-1}(n-1)\eta_m(n)B'_{m-1}(n-1) \quad \text{Equation 39}$$

$$\xi_m(n) = \xi_{m-1}(n) - K_{m-1}(n-1)\beta_{m-1}(n) \quad \text{Equation 40}$$

$$K_m(n) = K_m(n-1) + \gamma_m(n)\beta_m(n)\xi_{m+1}(n)B'_m(n) \quad \text{Equation 41}$$

$$\gamma_m(n) = \gamma_{m-1}(n) - \gamma_{m-1}^2(n)|\beta_{m-1}(n)|^2 B'_{m-1}(n) \quad \text{Equation 42}$$

As given earlier in Equation 31, the region of convergence needs to be satisfied for the binomial expansion to hold true, and the term "b² x²" needs to be substantially smaller than the term "a2" for a single term in the series to provide sufficient convergence precision. It was found that as λ approaches "1", "b²X²" becomes substantially smaller than "a²".

Figure 5:
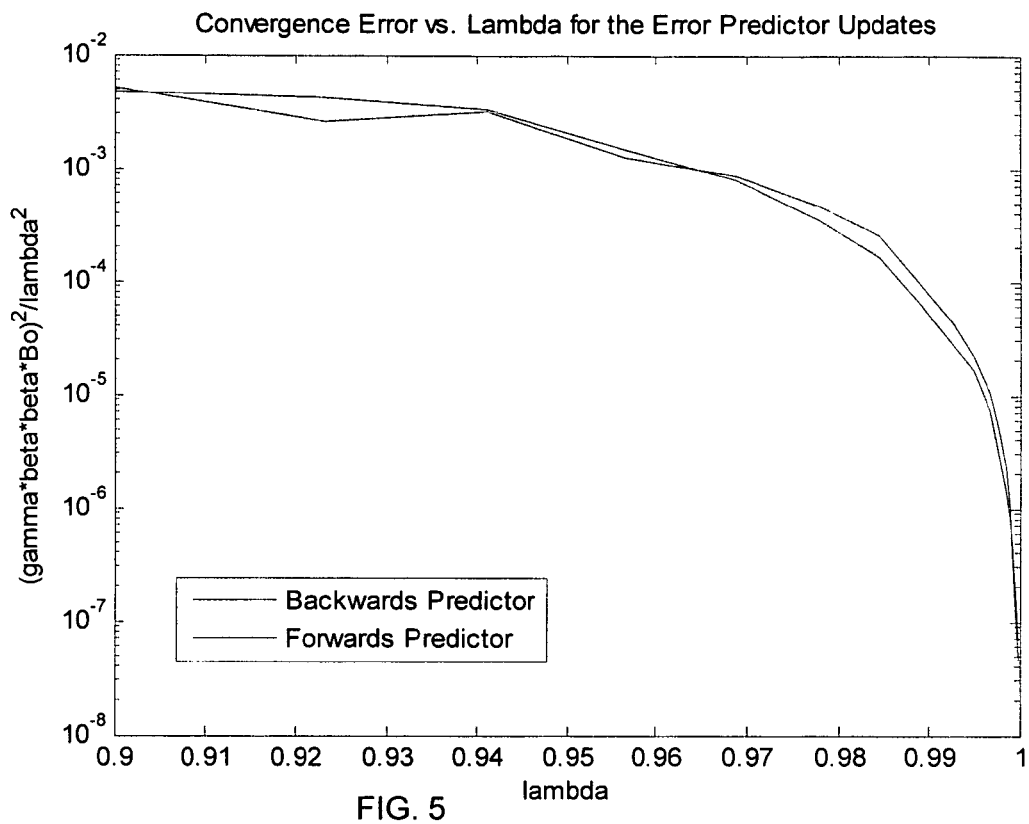
FIG. 5 is a graph illustrating a binomial expansion mean convergence error versus Lambda ($\lambda$)

Referring to FIG. 5, the graph shows how the "b² x²" term decreases relative to the "a²" term in the series expansion as λ approaches "1". This FIG. 5 graph plots the convergence error versus λ for the forward error prediction squares F'm(n) an the backward error prediction squares B'm (n), as shown in the following equation:

$$\left(\frac{b^2 x^2}{a^2}\right) = \left(\frac{-F'_m(n-1)\gamma_m(n-1)|\eta_m(n)|^2}{\lambda}\right)^2$$

and $$\left(\frac{-B'_m(n-1)\gamma_m(n)|\beta_m(n)|^2}{\lambda}\right)^2 \text{ vs } \lambda.$$

To satisfy the region of convergence criteria, this relation only needs to be less than "1" which simply implies that as the number of terms in the series expansion summed together increases, the convergence error approaches zero. However, to reduce real time requirements, as few terms as possible may need to be used in order to achieve the required convergence precision. FIG. 5 indicates that a large λ (close to "1") needs to be used to approach this required convergence precision. In practice, typically values for λ are greater than 0.999 to provide adequate performance with only one term (beside the constant term) in the expansion series.

Figure 6:
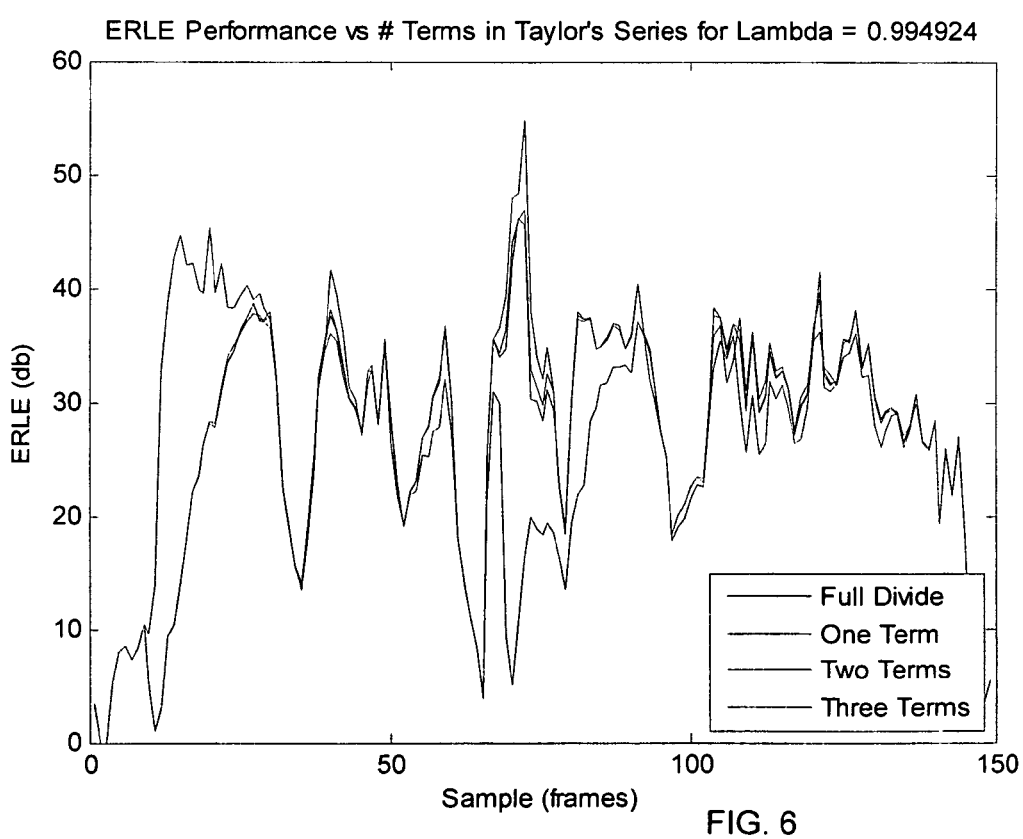
FIG. 6 is a graph illustrating echo return loss enhancements (ERLE) results for different Taylor's Series lengths when $\lambda=0.994924$.
Figure 7:
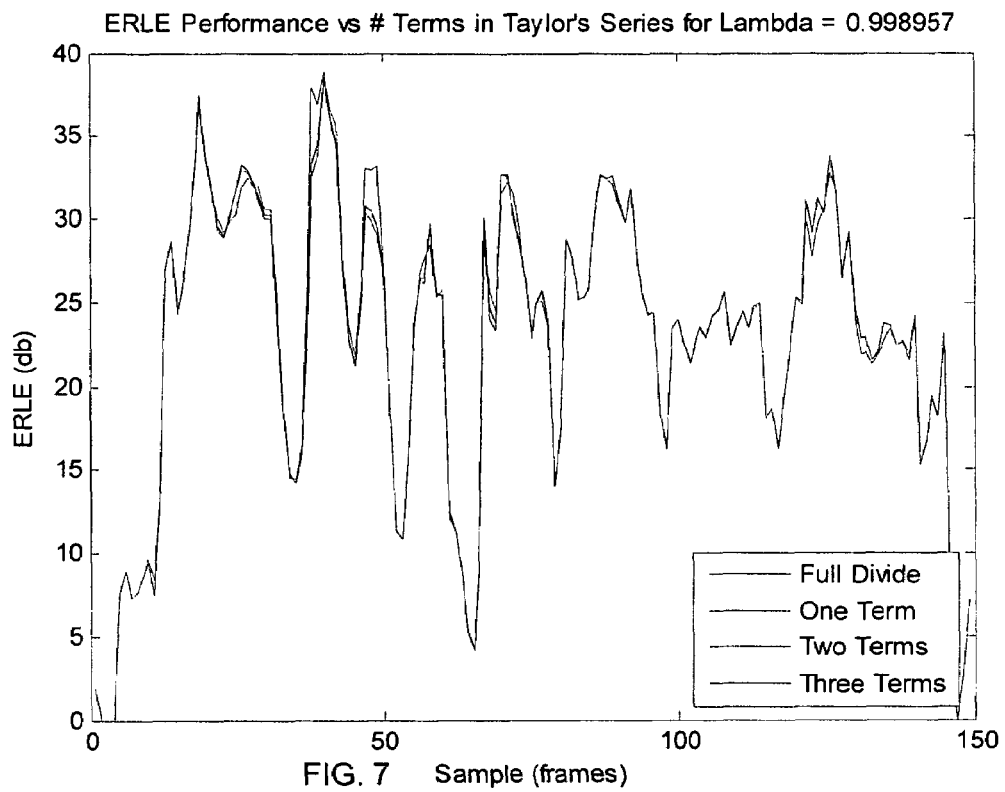
FIG. 7 is a graph illustrating echo return loss enhancements (ERLE) results for different Taylor's Series lengths when $\lambda=0.998957$.
Figure 8:
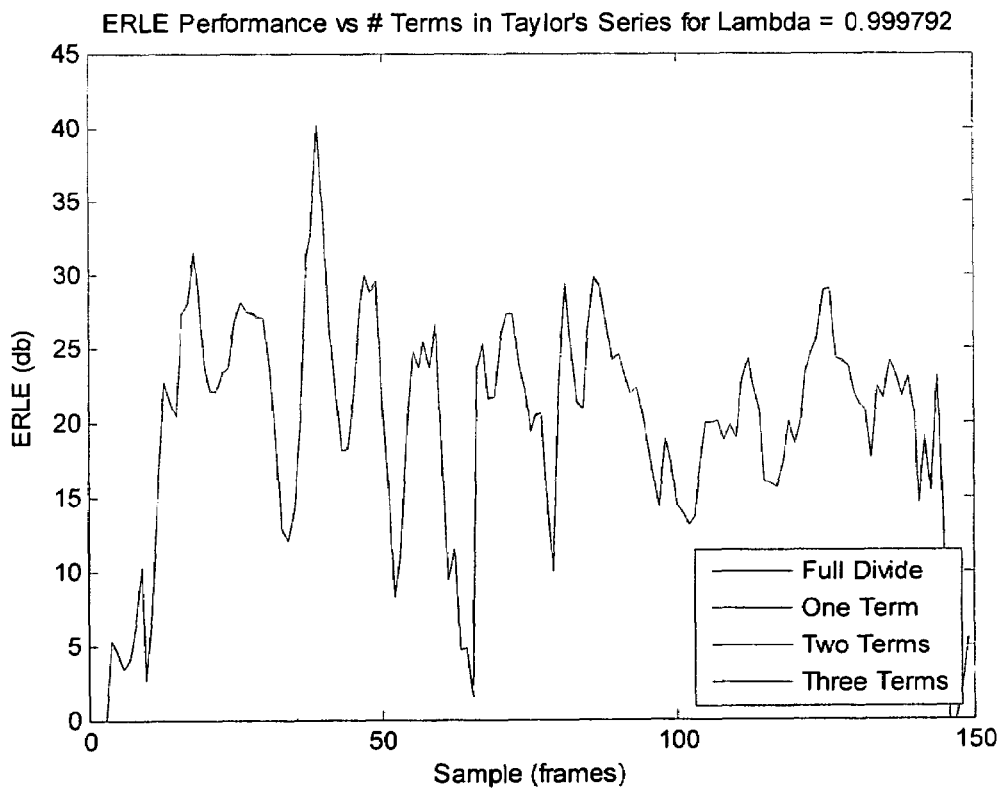
FIG. 8 is a graph illustrating echo return loss enhancements (ERLE) results for different Taylor's Series lengths when $\lambda=0.999792$.

The adaptive filter performance was then measured for three different values of λ using the full divide and then one, two and three terms in a Taylor's series approximation for comparison. These results are shown in FIG. 6, FIG. 7, and FIG. 8. The graphs reinforce the fact that as λ approaches "1" the approximation becomes substantially good and only one term may be needed to achieve an acceptable performance.

Figure 9:
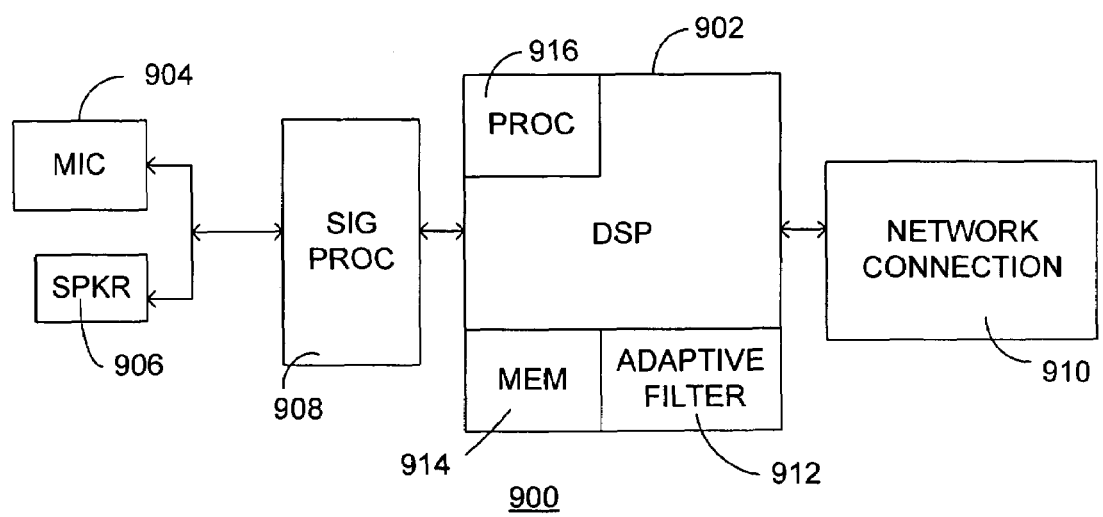
FIG. 9 is a block diagram of a communication device employing an adaptive filter.

FIG. 9 is a block diagram of a communication device 900 employing an adaptive filter. The communication device 900 includes a DSP 902, a microphone 904, a speaker 906, an analog signal processor 908 and a network connection 910. The DSP 902 may be any processing device including a commercially available digital signal processor adapted to process audio and other information.

The communication device 900 includes a microphone 904 and speaker 906 and analog signal processor 908. The microphone 904 converts sound waves impressed thereon to electrical signals. Conversely, the speaker 906 converts electrical signals to audible sound waves. The analog signal processor 908 serves as an interface between the DSP, which operates on digital data representative of the electrical signals, and the electrical signals useful to the microphone 904 and 906. In some embodiments, the analog signal processor 908 may be integrated with the DSP 902.

The network connection 910 provides communication of data and other information between the communication device 900 and other components. This communication may be over a wire line, over a wireless link, or a combination of the two. For example, the communication device 900 may be embodied as a cellular telephone and the adaptive filter 912 operates to process audio information for the user of the cellular telephone. In such an embodiment, the network connection 910 is formed by the radio interface circuit that communicates with a remote base station. In another embodiment, the communication device 900 is embodied as a hands-free, in-vehicle audio system and the adaptive filter 912 is operative to serve as part of a double-talk detector of the system. In such an embodiment, the network connection 910 is formed by a wire line connection over a communication bus of the vehicle.

In the embodiment of FIG. 9, the DSP 902 includes data and instructions to implement an adaptive filter 912, a memory 914 for storing data and instructions and a processor 916. The adaptive filter 912 in this embodiment is an RLSL adaptive filter of the type generally described herein. In particular, the adaptive filter 912 is enhanced to reduce the number of calculations required to implement the RLSL algorithm as described herein. The adaptive filter 912 may include additional enhancements and capabilities beyond those expressly described herein. The processor 916 operates in response to the data and instructions implementing the adaptive filter 912 and other data and instructions stored in the memory 914 to process audio and other information of the communication device 900.

In operation, the adaptive filter 912 receives an input signal from a source and provides a filtered signal as an output. In the illustrated embodiment, the DSP 902 receives digital data from either the analog signal processor 908 or the network interface 910. The analog signal processor 908 and the network interface 910 thus form means for receiving an input signal. The digital data forms the input signal. As part of audio processing, the processor 916 of DSP 902 implements the adaptive filter 912. The data forming the input signal is provided to the instructions and data forming the adaptive filter. The adaptive filter 912 produces an output signal in the form of output data. The output data may be further processed by the DSP 902 or passed to the analog signal processor 908 or the network interface 910 for further processing.

The communication device 900 may be modified and adapted to other embodiments as well. The embodiments shown and described herein are intended to be exemplary only.

It is therefore intended that the foregoing detailed description be regarded as illustrative rather than limiting, and that it be understood that it is the following claims, including all equivalents, that are intended to define the spirit and scope of this invention.

The invention claimed is:

1. A method for reducing computational complexity of an m-stage adaptive filter, the method comprising:
   receiving an input signal-to be filtered;
   developing a set of filter coefficients for the received input signal;
   expanding a weighted sum of forward prediction error squares into a corresponding binomial expansion series;
   expanding a weighted sum of backward prediction error squares into a corresponding binomial expansion series;
   determining coefficient updates of the adaptive filter with the weighted sum of forward and backward prediction error squares approximated by a select number of terms of their corresponding binomial expansion series;
   filtering the received input signal in accordance with the updated coefficients to produce a filtered signal; and
   providing the filtered signal as an output signal.

2. The method of claim 1 further comprising:
   pre-calculating a constant weighting factor; and
   updating the weighted sum of forward and backward prediction error squares using the pre-calculated constant weighting factor.

3. The method of claim 2 further comprising:
   selecting a value of the constant weighting factor greater than 0.999; and
   using a single term of the corresponding binomial expansion series of the forward and backward prediction error squares when determining the coefficient updates of the adaptive filter.

4. A method for an m-stage recursive least squares lattice structure adaptive filter, the method comprising:
   receiving an input signal to be filtered at an input of the adaptive filter;
   developing a set of filter coefficients for the received input signal;
   updating the set of filter coefficients by estimating an expansion of Taylor's theorem within a given region of convergence;
   filtering the input signal using the updated set of filter coefficients; and
   producing a filtered signal at an output of the adaptive filter.

5. The method of claim 4 wherein updating the set of filter coefficients comprises:
   estimating a forward error prediction square term using a first Taylor series expansion; and
   estimating a backward error prediction square term using a second Taylor series expansion.

6. The method of claim 5 further comprising:
   pre-calculating a constant weighting factor; and
   estimating the forward error prediction square term and the backward error prediction square term using the pre-calculated constant weighting factor.

7. The method of claim 6 further comprising:
   selecting a value of the constant weighting factor greater than 0.999 so that a single term of the first Taylor series expansion or the second Taylor series expansion may be used for estimating the forward error prediction square term and the backward error prediction square term.

8. An adaptive filter comprising:
   an interface to receive an input signal;
   a processor operative in conjunction with stored data and instructions to recursively update filter coefficients for each stage of the adaptive filter while producing a filtered signal, the processor configured to updating the set of filter coefficients by estimating an expansion of Taylor's theorem within a given region of convergence; and
   an interface to provide the filtered signal as an output signal.

9. The adaptive filter of claim 8 wherein the processor is operative to
   estimate a forward error prediction square term using a Taylor series expansion; and
   estimate a backward error prediction square term using a Taylor series expansion.

* * * * *